United States Patent
Gao et al.

(10) Patent No.: US 12,148,897 B2
(45) Date of Patent: Nov. 19, 2024

(54) ELECTROCHEMICAL CELL MONITORING ASSEMBLY

(71) Applicant: GM GLOBAL TECHNOLOGY OPERATIONS LLC, Detroit, MI (US)

(72) Inventors: Jing Gao, Rochester, MI (US); Brian J. Koch, Berkley, MI (US); Gayatri V. Dadheech, Bloomfield Hills, MI (US); Mark W. Verbrugge, Troy, MI (US); Alok Warey, Novi, MI (US); James R. Salvador, East Lansing, MI (US); Robert D. Schmidt, Howell, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 689 days.

(21) Appl. No.: 17/160,553

(22) Filed: Jan. 28, 2021

(65) Prior Publication Data
US 2022/0238932 A1    Jul. 28, 2022

(51) Int. Cl.
*H01M 10/48* (2006.01)
*G01R 31/389* (2019.01)
(Continued)

(52) U.S. Cl.
CPC .......... *H01M 10/48* (2013.01); *G01R 31/389* (2019.01); *G01R 31/392* (2019.01);
(Continued)

(58) Field of Classification Search
CPC .................................................. H01M 10/48
See application file for complete search history.

(56) References Cited

U.S. PATENT DOCUMENTS

| | | |
|---|---|---|
| 8,974,946 B2 | 3/2015 | Cai et al. |
| 9,123,939 B2 | 9/2015 | Xiao et al. |

(Continued)

FOREIGN PATENT DOCUMENTS

| | | |
|---|---|---|
| CN | 108352253 A | 7/2018 |
| CN | 114814626 A | 7/2022 |
| DE | 102021130703 A1 | 7/2022 |

OTHER PUBLICATIONS

Circuit Globe, Resistive Transducer, Sep. 17, 2017 (Year: 2017).*

(Continued)

*Primary Examiner* — Ula C Ruddock
*Assistant Examiner* — Mary Grace Byram
(74) *Attorney, Agent, or Firm* — Harness, Dickey & Pierce, P.L.C.

(57) ABSTRACT

A monitoring assembly for an electrochemical cell of a secondary lithium battery includes a porous sensory structure and a transducer. The porous sensory structure includes a sensory layer disposed on a major surface of a porous separator and a buffer layer disposed between the sensory layer and a facing surface of a negative electrode layer. The buffer layer electrically isolates the sensory layer from the facing surface of the negative electrode layer. The sensory layer includes an electrically conductive material and is configured to produce a response to an input signal or to a physical stimulus received within the electrochemical cell. The transducer is configured to process the response produced by the sensory layer to generate an output signal indicative of a diagnostic condition within the electrochemical cell.

20 Claims, 4 Drawing Sheets

(51) Int. Cl.
*G01R 31/392* (2019.01)
*H01M 10/0525* (2010.01)
*H01M 10/0585* (2010.01)
*H01M 10/42* (2006.01)

(52) U.S. Cl.
CPC ... *H01M 10/0525* (2013.01); *H01M 10/0585* (2013.01); *H01M 10/425* (2013.01); *H01M 10/4285* (2013.01); H01M 2010/4278 (2013.01)

(56) References Cited

U.S. PATENT DOCUMENTS

| | | | |
|---|---|---|---|
| 9,160,036 B2 | 10/2015 | Yang et al. |
| 9,252,411 B2 | 2/2016 | Abd Elhamid et al. |
| 9,302,914 B2 | 4/2016 | Liu et al. |
| 9,362,552 B2 | 6/2016 | Sohn et al. |
| 9,373,829 B2 | 6/2016 | Xiao et al. |
| 9,437,871 B2 | 9/2016 | Zhou et al. |
| 9,647,254 B2 | 5/2017 | Dadheech et al. |
| 9,742,028 B2 | 8/2017 | Zhou et al. |
| 9,896,763 B2 | 2/2018 | Dadheech et al. |
| 9,905,847 B2 | 2/2018 | Dadheech et al. |
| 9,923,189 B2 | 3/2018 | Xiao |
| 9,929,435 B2 | 3/2018 | Cai et al. |
| 9,979,008 B2 | 5/2018 | Dai et al. |
| 9,985,284 B2 | 5/2018 | Dadheech et al. |
| 10,084,204 B2 | 9/2018 | Dai et al. |
| 10,128,481 B2 | 11/2018 | Xiao et al. |
| 10,141,559 B2 | 11/2018 | Xiao et al. |
| 10,199,643 B2 | 2/2019 | Zhou et al. |
| 10,312,501 B2 | 6/2019 | Yang et al. |
| 10,326,166 B2 | 6/2019 | Yang et al. |
| 10,367,201 B2 | 7/2019 | Yang et al. |
| 10,381,170 B2 | 8/2019 | Dai et al. |
| 10,396,360 B2 | 8/2019 | Xiao et al. |
| 10,431,849 B2 | 10/2019 | Yersak et al. |
| 10,573,879 B2 | 2/2020 | Yang et al. |
| 10,622,627 B2 | 4/2020 | Dadheech et al. |
| 10,629,941 B2 | 4/2020 | Dai et al. |
| 10,629,949 B2 | 4/2020 | Yersak et al. |
| 10,680,281 B2 | 6/2020 | Yersak et al. |
| 10,734,673 B2 | 8/2020 | Yersak et al. |
| 10,991,946 B2 | 4/2021 | Xiao et al. |
| 11,101,501 B2 | 8/2021 | Liu et al. |
| 11,239,459 B2 | 2/2022 | Yersak et al. |
| 11,328,878 B2 | 5/2022 | Dai et al. |
| 2007/0210752 A1* | 9/2007 | Yoon | H01M 10/482 320/116 |
| 2009/0104510 A1* | 4/2009 | Fulop | H01M 50/553 429/50 |
| 2011/0112781 A1* | 5/2011 | Anderson | G01R 31/392 702/63 |
| 2013/0002260 A1* | 1/2013 | Golubkov | H01M 10/486 324/426 |
| 2013/0004811 A1* | 1/2013 | Banerjee | H01M 10/443 374/185 |
| 2014/0265557 A1 | 9/2014 | Huang et al. |
| 2015/0056387 A1 | 2/2015 | Dadheech et al. |
| 2015/0056493 A1 | 2/2015 | Dadheech et al. |
| 2015/0056507 A1 | 2/2015 | Dadheech et al. |
| 2015/0349307 A1 | 12/2015 | Dadheech et al. |
| 2016/0111721 A1 | 4/2016 | Xiao et al. |
| 2016/0172706 A1 | 6/2016 | Xiao et al. |
| 2016/0190856 A1* | 6/2016 | Baek | H04W 4/80 320/108 |
| 2017/0162845 A1* | 6/2017 | Gansemer | H01M 10/4257 |
| 2017/0271678 A1 | 9/2017 | Yang et al. |
| 2018/0251919 A1 | 9/2018 | Mankame et al. |
| 2019/0190092 A1* | 6/2019 | Kim | H01M 10/48 |
| 2019/0207205 A1* | 7/2019 | Adair | H01M 4/0483 |
| 2019/0372155 A1 | 12/2019 | Yersak et al. |
| 2021/0050619 A1 | 2/2021 | Yersak et al. |
| 2022/0181712 A1 | 6/2022 | Dadheech et al. |
| 2022/0255151 A1* | 8/2022 | Kim | G01R 31/3865 |
| 2022/0407126 A1* | 12/2022 | Gao | H01M 10/44 |

OTHER PUBLICATIONS

Verizon, How Does Wireless Charging Work?, Jan. 23, 2021 (Year: 2021).*

Gayatri V. Dadheech, Mark W. Vergrugge, Alok Warey, Brian J. Koch, Jing Gao, "Reference Electrode Assembly and Method of Manufacturing the Same", U.S. Appl. No. 17/112,031, filed Dec. 4, 2020, 34 pages.

Janghoon Park et al.; "Roll-to-Roll Coating Technology and Its Applications: A Review"; International Journal of Precision Engineering and Manufacturing, vol. 17, No. 4; Apr. 2016; pp. 537-550.

* cited by examiner

ELECTROCHEMICAL CELL MONITORING ASSEMBLY

INTRODUCTION

The present invention relates to a monitoring assembly and, more particularly, to a monitoring assembly for electrochemical cells of secondary lithium batteries.

A battery is a device that converts chemical energy into electrical energy by means of electrochemical reduction-oxidation (redox) reactions. In secondary or rechargeable batteries, these electrochemical reactions are reversible, which allows the batteries to undergo multiple charging and discharge cycles.

Secondary lithium batteries generally comprise one or more electrochemical cells that operate by reversibly passing lithium ions between a negative electrode and a positive electrode. The negative and positive electrodes are oftentimes disposed on opposite sides of a porous polymeric separator, and each of the negative and positive electrodes is typically carried on, or connected to, a metallic current collector. The negative and positive electrodes and the polymeric separator are infiltrated with an ionically conductive electrolyte that provides a medium for the conduction of lithium ions through the electrochemical cell between the negative and positive electrodes. In practice, an electrochemical potential is established between the negative and positive electrodes of the electrochemical cell by connecting their respective current collectors to one another via a controllable and interruptible external circuit.

During discharge of the electrochemical cell, the electrochemical potential established between the negative and positive electrodes drives spontaneous redox reactions within the electrochemical cell and the release of lithium ions and electrons at the negative electrode. The released lithium ions travel from the negative electrode to the positive electrode through the ionically conductive electrolyte, and the electrons travel from the negative electrode to the positive electrode via the external circuit, which generates an electric current. After the negative electrode has been partially or fully depleted of lithium, the electrochemical cell may be recharged by connecting the negative and positive electrodes to an external power source, which drives nonspontaneous redox reactions within the electrochemical cell and the release of the lithium ions and the electrons from the positive electrode. During recharge, the released lithium ions return to the negative electrode and may be plated on a surface of the negative electrode (e.g., on a surface of the negative electrode current collector), inserted or intercalated between lattice structures of the negative electrode material, or the lithium ions may react (e.g., alloy) with the negative electrode material to form lithium-containing intermetallic phases.

After repeated discharge and recharge cycles, the physical structure of various components of the electrochemical cell (e.g., the negative and positive electrodes and the porous polymeric separator) may be altered. In some instances, it may be desirable to diagnose and/or monitor changes in the physical structure of these components during operation of the electrochemical cell over time.

SUMMARY

A monitoring assembly for an electrochemical cell of a secondary lithium battery is disclosed. The monitoring assembly may comprise a porous sensory structure and a transducer. The porous sensory structure may be disposed between a major surface of a porous separator and a facing surface of a negative electrode layer. The porous sensory structure may include a sensory layer and a buffer layer. The sensory layer may be disposed on the major surface of the porous separator and may include an electrically conductive material. The sensory layer may be configured to produce a response to an input signal or to a physical stimulus. The buffer layer may be disposed between the sensory layer and the facing surface of the negative electrode layer. The buffer layer may be made of an electrically insulating material that electrically isolates the sensory layer from the facing surface of the negative electrode layer. The transducer may be configured to process the response produced by the sensory layer to generate an output signal indicative of a diagnostic condition of the porous separator or the negative electrode layer.

The electrically conductive material of the sensory layer may include particles of at least one of nickel, copper, titanium, silver, gold, or carbon.

The electrically insulating material of the buffer layer may include at least one of $Al_2O_3$, $SiO_2$, $ZrO_2$, $TiO_2$, $ZnO$, $Ta_2O_5$, $La_2O_5$, $HfO$, lithium-lanthanum-zirconium oxide, a zeolite, polytetrafluoroethylene, aluminum alkoxide, zirconium alkoxide, titanium alkoxide, or diamond-like carbon.

The transducer may be configured to process the response produced by the sensory layer into an electrical signal, an electromagnetic signal, or a mechanical signal.

The transducer may be an antenna or a resonator. In such case, the transducer may be integrated into the sensory layer by patterning the electrically conductive material of the sensory layer into the form of the antenna or the resonator.

The transducer may be physically separate from the sensory layer. In such case, the transducer may be electrically coupled to the sensory layer via an electrical circuit.

The output signal generated by the transducer may be indicative of formation of a lithium dendrite that extends from the facing surface of the negative electrode layer and penetrates the sensory layer.

The porous sensory structure may include a first sensory layer disposed on the major surface of the porous separator, a first buffer layer overlying the first sensory layer, a second sensory layer overlying the first buffer layer, and a second buffer layer overlying the second sensory layer on the major surface of the porous separator. In such case, the output signal generated by the transducer may be indicative of formation of a lithium dendrite that extends from the facing surface of the negative electrode layer and penetrates the first sensory layer. The output signal generated by the transducer also may be indicative of a growth rate of the lithium dendrite.

The output signal generated by the transducer may be indicative of an electrical resistance of the sensory layer. In such case, the output signal generated by the transducer may be indicative of a compressive force or a tensile force applied to the sensory layer that results in physical deformation of the sensory layer.

The monitoring assembly may comprise a microcontroller configured to process the output signal generated by the transducer into data and to store the data in local memory as a function of time. In such case, the microcontroller may be electrically coupled to the sensory layer via an electrical circuit.

An electrochemical cell of a secondary lithium battery is disclosed. The electrochemical cell may comprise a positive electrode layer electrically coupled to a positive electrode current collector, a negative electrode layer spaced apart from the positive electrode layer and electrically coupled to a negative electrode current collector, a porous separator disposed between the positive electrode layer and the negative electrode layer, and a monitoring assembly. The porous separator may be disposed between the positive electrode layer and the negative electrode layer and may have a first major surface and an opposite second major surface. The first major surface of the porous separator may face toward a facing surface of the negative electrode layer. The monitoring assembly may include a porous sensory structure and a transducer. The porous sensory structure may be disposed between the first major surface of the porous separator and the facing surface of the negative electrode layer. The porous sensory structure may include a sensory layer and a buffer layer. The sensory layer may be disposed on the first major surface of the porous separator and may include an electrically conductive material. The sensory layer may be configured to produce a response to an input signal or to a physical stimulus. The buffer layer may be disposed between the sensory layer and the facing surface of the negative electrode layer. The buffer layer may be made of an electrically insulating material that electrically isolates the sensory layer from the facing surface of the negative electrode layer. The transducer may be configured to process the response produced by the sensory layer to generate an output signal indicative of a diagnostic condition within the electrochemical cell.

The electrochemical cell may comprise a microcontroller configured to process the output signal generated by the transducer into data and to store the data in local memory as a function of time. The microcontroller may be electrically coupled to the negative electrode current collector via a first electrical connector and may be electrically coupled to the positive electrode current collector via a second electrical connector. In such case, the microcontroller may be powered by an electrical potential difference between the negative electrode current collector and the positive electrode current collector.

The porous separator and the porous sensory structure may be infiltrated with a nonaqueous liquid electrolyte solution.

The sensory layer may include an electrochemically active reference electrode material. In such case, the electrochemically active reference electrode material may comprise at least one metal oxide of lithium iron phosphate, lithium titanium oxide, or lithium nickel manganese cobalt oxide.

The porous separator may be made of an ionically conductive polymeric material. In such case, the ionically conductive polymeric material may comprise at least one of polyethylene, polypropylene, polyamide, poly(tetrafluoroethylene), polyvinylidene fluoride, or poly(vinyl chloride).

The negative electrode layer may comprise at least one of graphite or silicon. Or the negative electrode layer may comprise a layer of lithium metal. In such case, the layer of lithium metal may comprise, by weight, greater than 97% lithium.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

BRIEF DESCRIPTION OF THE DRAWINGS

Illustrative embodiments will hereinafter be described in conjunction with the appended drawings, wherein like designations denote like elements, and wherein.

Figure 1:
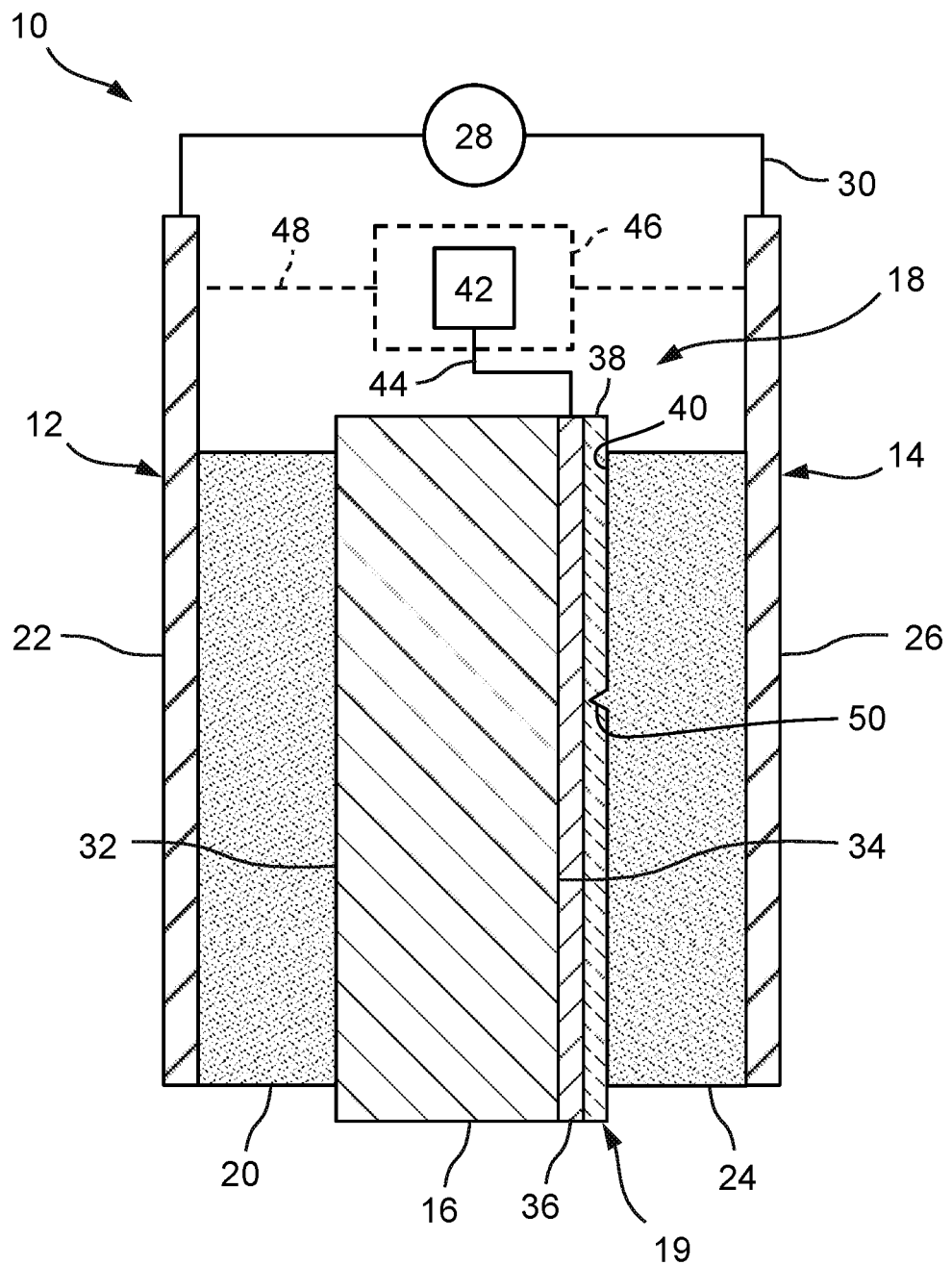
FIG. 1 is a schematic side cross-sectional view of an electrochemical cell of a secondary lithium battery, the electrochemical cell includes a monitoring assembly that uses a porous sensory structure in combination with a transducer to diagnose and/or monitor certain conditions within the electrochemical cell, wherein the porous sensory structure includes a sensory layer disposed on a major surface of a porous separator and a buffer layer that electrically isolates the sensory layer from a facing surface of a negative electrode material layer.

The present disclosure is susceptible to modifications and alternative forms, with representative embodiments shown by way of example in the drawings and described in detail below. Inventive aspects of this disclosure are not limited to the particular forms disclosed. Rather, the present disclosure is intended to cover modifications, equivalents, combinations, and alternatives falling within the scope of the disclosure as defined by the appended claims.

DETAILED DESCRIPTION

The presently disclosed monitoring assembly may be incorporated into an electrochemical cell and used to monitor one or more diagnostic conditions of the electrochemical cell. The presently disclosed monitoring assembly includes a porous sensory structure, including a sensory layer and a buffer layer, disposed between a negative electrode layer and a porous separator layer of the electrochemical cell. The sensory layer includes an electrically conductive material and is configured to produce a response to certain input signals or other stimuli. The monitoring assembly also includes a transducer that is configured to transduce or otherwise process the response produced by the sensory layer into an output signal that can be used to diagnose certain conditions within the electrochemical cell. In assembly, the buffer layer is disposed between the sensory layer and the negative electrode layer and electrically isolates the sensory layer from the negative electrode layer during operation of the electrochemical cell.

In embodiments, the presently disclosed monitoring assembly may be configured to diagnose the formation of lithium dendrites on the surface of the negative electrode layer and may be configured to determine the penetration depth of the lithium dendrites and/or to track the growth rate of the lithium dendrites. Additionally or alternatively, the presently disclosed monitoring assembly may be configured to diagnose volumetric changes (e.g., expansion) of the negative electrode layer and/or the porous separator layer. In some embodiments, the sensory layer may be configured to act as a reference in measuring the individual electrochemical potentials of the negative electrode layer and a positive electrode layer of the electrochemical cell.

The transducer may be physically incorporated into the electrochemical cell, for example, by being integral with the sensory layer or by being incorporated into a microcontroller associated with the electrochemical cell. In other embodiments, the transducer may be part of an external control device that is electrically coupled to or otherwise in communication with the sensory layer. In embodiments where the electrochemical cell is combined with one or more electrochemical cells to form a secondary lithium battery, the external control device may be in the form of a battery controller, and together the secondary lithium battery and the battery controller may form a battery system that supplies power to an electric machine. In other embodiments, such as in laboratory environments, the external control device may be in the form of a battery testing or calibration machine, and the transducer may be part of the battery testing or calibration machine.

The term "transducer" as used herein means a device or structure that receives an input signal or stimulus (in one form of energy) and produces an output signal in response to the input signal or stimulus that may be in another form of energy.

FIG. 1 depicts a schematic side cross-sectional view of an electrochemical cell 10 that may be combined with one or more additional electrochemical cells to form a secondary battery, such as a lithium ion or lithium metal battery (sometimes referred to herein as a "lithium battery" for simplicity). The electrochemical cell 10 includes a positive electrode 12, a negative electrode 14, a porous separator 16 that electrically isolates the positive and negative electrodes 12, 14 from each other, and a monitoring assembly 18 including a porous sensory structure 19 disposed between and electrically isolated from the positive and negative electrodes 12, 14. The positive electrode 12 includes a positive electrode material layer 20 deposited on a major surface of a positive electrode current collector 22, and the negative electrode 14 includes a negative electrode material layer 24 deposited on a major surface of a negative electrode current collector 26. In practice, the positive and negative electrode current collectors 22, 26 may be electrically coupled to a power source or load 28 via an external circuit 30.

The positive electrode material layer 20 may comprise one or more electrochemically active materials that can undergo a reversible redox reaction with lithium, e.g., a material that can sufficiently undergo lithium intercalation and deintercalation, alloying and dealloying, or plating and stripping.

The negative electrode material layer 24 may comprise an electrochemically active material that can undergo a reversible redox reaction with lithium during operation of the electrochemical cell 10 and/or the negative electrode material layer 24 may comprise a layer of lithium (Li) metal or a lithium metal alloy. In some embodiments, the negative electrode material layer 24 may consist essentially of lithium metal and may comprise, by weight, greater than 97% lithium or, more preferably, greater than 99% lithium. In other embodiments, the negative electrode material layer 24 may comprise a material that can undergo the reversible insertion or intercalation of lithium ions or that can react with lithium to form a lithium-containing intermetallic compound. For example, in such case, the negative electrode material layer 24 may comprise graphite, silicon, or a silicon alloy.

The positive and negative electrode current collectors 22, 26 may comprise a material (e.g., a metal or a metal alloy) that can collect and reversibly passing free electrons to and from their respective electrode material layers 20, 24.

The porous separator 16 is positioned between the positive electrode 12 and the porous sensory structure 19 of the monitoring assembly 18. The porous separator 16 has a first major surface 32 that faces toward the positive electrode 12 and an opposite second major surface 34 that faces toward the porous sensory structure 19 and the negative electrode 14. The porous separator 16 exhibits an open microporous structure and may comprise an organic and/or inorganic material that can physically separate and electrically insulate the positive and negative electrode material layers 20, 24 from each other while permitting the free flow of ions therebetween. The porous separator 16 may comprise a non-woven material, e.g., a manufactured sheet, web, or matt of directionally or randomly oriented fibers. The porous separator 16 may comprise a microporous polymeric material, e.g., a microporous polyolefin-based membrane or film. For example, the porous separator 16 may comprise a single polyolefin or a combination of polyolefins, such as polyethylene (PE), polypropylene (PP), polyamide (PA), poly(tetrafluoroethylene) (PTFE), polyvinylidene fluoride (PVdF), and/or poly(vinyl chloride) (PVC). In one form, the porous separator 16 may comprise a laminate of one or more polymeric materials, such as a laminate of PE and PP. The porous separator 16 may have a thickness in the range of 5 µm to 30 µm and a porosity in a range of 25% to 75%.

In assembly, the porous separator 16, the porous sensory structure 19 of the monitoring assembly 18, and the positive and negative electrode material layers 20, 24 of the electrochemical cell 10 may be infiltrated with an electrolyte (not shown). The electrolyte may comprise a material that can effectively conduct lithium ions through the porous separator 16 and the porous sensory structure 19, and between the positive electrode material layer 20 and the negative electrode material layer 24 during operation of the electrochemical cell 10. For example, the electrolyte may comprise a non-aqueous liquid electrolyte. In such case, the non-aqueous liquid electrolyte may comprise a solution including a lithium salt dissolved or ionized in a nonaqueous, aprotic organic solvent or a mixture of nonaqueous, aprotic organic solvents. Some suitable lithium salts that may be used to make the electrolyte include $LiClO_4$, $LiAlCl_4$, LiI, LiBr, LiSCN, $LiBF_4$, $LiB(C_6H_5)_4$, $LiAsF_6$, $LiCF_3SO_3$, $LiN(CF_3SO_2)_2$, $LiPF_6$, and combinations thereof. The nonaqueous, aprotic organic solvent in which the lithium salt is dissolved may be a cyclic carbonate (i.e., ethylene carbonate, propylene carbonate), an acyclic carbonate (i.e., dimethyl carbonate, diethyl carbonate, ethyl methyl carbonate), an aliphatic carboxylic ester (i.e., methyl formate, methyl acetate, methyl propionate), a γ-lactone (i.e., γ-butyrolactone, γ-valerolactone), an acyclic ether (i.e., 1,2-dimethoxyethane, 1,2-diethoxyethane, ethoxymethoxyethane), a cyclic ether (i.e., tetrahydrofuran, 2-methyltetrahydrofuran), or a combination thereof. As another example, the non-aqueous electrolyte may comprise a gel or plasticized polymer electrolyte. In such case, the non-aqueous electrolyte may comprise a polymer host material soaked with a non-aqueous liquid electrolyte solution. Some examples of suitable polymer host materials include poly(vinylidene) (PVdF), poly(acrylonitrile) (PAN), poly(methyl methacrylate) (PMMA), poly(ethylene oxide) (PEO), polyacrylates, and poly(vinylidene fluoride-hexafluoropropylene) (PVdF-HFP).

The monitoring assembly 18 is configured to diagnose and/or monitor certain conditions within the electrochemical cell 10 that may affect the performance and/or cycle life of the electrochemical cell 10, without interfering with the operation of the electrochemical cell 10, in particular, without inhibiting the free flow of ions between the positive and negative electrode material layers 20, 24. In the monitoring assembly 18, the porous sensory structure 19 cooperates with at least one transducer 42 to sense and/or transmit information about certain aspects of the electrochemical cell 10 and/or its components that can be used to diagnose certain conditions within the electrochemical cell 10. The porous sensory structure 19 includes at least one sensory layer 36 and at least one buffer layer 38 that electrically isolates the sensory layer 36 from a facing surface 40 of the negative electrode material layer 24.

The sensory layer 36 is disposed on the second major surface 34 of the porous separator 16 and the buffer layer 38 is disposed between the sensory layer 36 and the facing surface 40 of the negative electrode material layer 24. In FIG. 1, the transducer 42 is depicted as being physically separate from the sensory layer 36 and electrically coupled to the sensory layer 36 via an electrical connector 44; however, this is not necessarily required. In other embodiments, the transducer 42 may be integrated into the physical construction of the sensory layer 36. In addition, in embodiments where the transducer 42 is physically separate from the sensory layer 36, the transducer 42 may be in wireless communication with the sensory layer 36, for example, via transmission and/or receipt of an electromagnetic signal (e.g., radio frequency (RF) radio waves, such as ultra-high frequency (UHF) radio waves). In some embodiments, the transducer 42 may be part of a microcontroller 46 associated with the electrochemical cell 10. The microcontroller 46, also referred to as a microcontroller unit, may be in the form of an integrated circuit including a central processing unit (CPU), random-access memory (RAM), flash memory, read-only memory (ROM), and/or an input/output (I/O) device. The microcontroller 46 may be associated with the electrochemical cell 10, for example, by being physically incorporated into a housing or case (not shown) for the electrochemical cell 10. In other embodiments, the transducer 42 may be part of an external control device (not shown) associated with the battery or another host. The external control device may be a computer including a central processing unit in the form of a microprocessor, memory, and one or more peripheral devices (e.g., a monitor and/or a battery testing device).

The transducer 42 and/or the microcontroller 46 optionally may be electrically coupled to the positive electrode current collector 22 and the negative electrode current collector 26 via an electric circuit 48, and the inherent electrical potential difference between the current collectors 22, 26 may supply power for operation of the transducer 42 and/or the microcontroller 46. In other embodiments, power may be supplied to the sensory layer 36, the transducer 42, and/or the microcontroller 46 by another power source, if desired.

The sensory layer 36 is porous and is configured to assist in diagnosing and/or monitoring certain conditions within the electrochemical cell 10 without interfering with the operation of the electrochemical cell 10, e.g., without inhibiting the free flow of lithium ions therethrough. The sensory layer 36 is configured to produce a response to an input signal or to another stimulus received within the electrochemical cell 10. For example, the sensory layer 36 may be configured to produce a response when exposed to a source of energy (e.g., an applied voltage, an electric current, and/or electromagnetic waves) or upon being subjected to a physical force, e.g., a compressive force or a tensile force, which may or may not result in physical deformation of the sensory layer 36. The response produced by the sensory layer 36 may be an electromagnetic signal (e.g., radio waves), a mechanical signal (e.g., an acoustic signal), an electric current, an electric field, a magnetic field, a change in shape, or other type of response that can be used, for example, by the transducer 42, the microcontroller 46, and/or an external control device, to diagnose certain conditions within the electrochemical cell 10. For example, the response produced by the sensory layer 36 may be used to diagnose lithium dendrite growth on the facing surface 40 of the negative electrode material layer 24 and optionally to indicate the extent of the lithium dendrite growth and the growth rate. Additionally or alternatively, the response produced by the sensory layer 36 may be used to diagnose volumetric changes in the porous separator 16 and/or the negative electrode material layer 24. When the porous separator 16, the negative electrode material layer 24, and/or another component of the electrochemical cell 10 experiences a change in volume (i.e., expands or contracts in volume), the change in volume may impart a compressive or tensile force on the sensory layer 36, which may eventually lead to deformation of the sensory layer 36.

The sensory layer 36 includes at least one electrically conductive material, and the functionality of the sensory layer 36 may be predetermined based upon the way the electrically conductive material is physically arranged in the sensory layer 36. In some embodiments, the sensory layer 36 (and the electrically conductive material thereof) may extend in a substantially continuous layer between the porous separator 16 and the negative electrode material layer 24 and may be commensurate in size with the area of the facing surface 40 of negative electrode material layer 24. In other embodiments, the sensory layer 36 (and the electrically conductive material thereof) may be arranged in the form of one or more patterns or physical structures that can function as a transducer (e.g., an antenna, capacitor, inductor, resistor, or resonator) when exposed to an energy source. In the sensory layer 36, the at least one electrically conductive material may be combined with one or more additional materials that may assist, for example, in deposition or adhesion of the sensory layer 36 on the second major surface 34 of the porous separator 16 or on the facing surface 40 of the negative electrode material layer 24 over the buffer layer 38.

The electrically conductive material of the sensory layer 36 may comprise or consist essentially of at least one of nickel, copper, titanium, silver, gold, or carbon. In practice, the pores of the porous sensory layer 36 may be infiltrated with an electrolyte. The electrically conductive material may account for, by weight, 50% to 100% of the sensory layer 36 and, more preferably, greater than 90% of the sensory layer 36, without accounting for the weight of electrolyte in the pores of the sensory layer 36. The sensory layer 36 may be deposited on the second major surface 34 of the porous separator 16 or on the facing surface 40 of the negative electrode material layer 24 over the buffer layer 38 using a printing process (e.g., an ink jet printing, aerosol printing, screen printing, or low velocity plasma jet printing process), magnetron sputtering, ion beam sputtering, a thermal evaporation process, or an electroless deposition or plating technique. The sensory layer 36 may have a thickness in a range of 10 nanometers to 1 micrometer, or more preferably in a range of 25 nanometers to 200 nanometers. The thickness and density of the sensory layer 36 may be selected so that the sensory layer 36 is thick enough and dense enough to form at least one continuous electrically conductive pathway therethrough, without inhibiting the free flow of lithium ions.

In some embodiments, the sensory layer 36 may serve as a reference for monitoring the electrical potential of the positive and negative electrode material layers 20, 24. In such case, the sensory layer 36 may include, in addition to the electrically conductive material, a reference electrode material, e.g., lithium iron phosphate, lithium titanium oxide, and/or lithium nickel manganese cobalt oxide. The reference electrode material may be dispersed throughout the sensory layer 36 or may be in the form of a separate layer overlying (or underlying) the sensory layer 36.

The buffer layer 38 is porous and is configured to electrically isolate the sensory layer 36 from the facing surface 40 of the negative electrode material layer 24 without inhibiting the free flow of lithium ions therethrough. The buffer layer 38 may comprise or consist essentially of at least one electrically insulating material. The electrically insulating material of the buffer layer 38 may comprise at least one of an electrically insulating ceramic material (e.g., $Al_2O_3$, $SiO_2$, $ZrO_2$, $TiO_2$, ZnO, $Ta_2O_5$, $La_2O_5$, HfO, lithium-lanthanum-zirconium oxide (Li—La—Zr—O), or a zeolite), an electrically insulating polymeric material (e.g., polytetrafluoroethylene), an electrically insulating composite material (e.g., aluminum alkoxide, zirconium alkoxide, titanium alkoxide), and/or diamond-like carbon. In the buffer layer 38, the electrically insulating material may be combined with one or more additional materials that may assist, for example, in deposition or adhesion of the buffer layer 38 on the second major surface 34 of the porous separator 16 over the sensory layer 36 or on the facing surface 40 of the negative electrode material layer 24. In practice, the pores of the porous buffer layer 38 may be infiltrated with an electrolyte. The electrically insulating material may account for, by weight, 50% to 100% of the buffer layer 38, preferably greater than 90% of the buffer layer 38, without accounting for the weight of the electrolyte in the pores of the buffer layer 38.

The buffer layer 38 may be deposited on the second major surface 34 of the porous separator 16 over the sensory layer 36 or the buffer layer 38 may be deposited on the facing surface 40 of the negative electrode material layer 24 using an atomic layer deposition process, a molecular layer deposition process, sputtering, a thermal evaporation process, or an ion beam deposition process. The buffer layer 38 may have a thickness in a range of 5 nanometers to 100 micrometers. The thickness and density of the buffer layer 38 may be selected so that the buffer layer 38 is thick enough and dense enough to effectively electrically isolate the sensory layer 36 from the negative electrode material layer 24, without inhibiting the free flow of lithium ions therethrough.

In assembly, the sensory layer 36 and the buffer layer 38 of the porous sensory structure 19 may be deposited on or otherwise formed on the second major surface 34 of the porous separator 16 or on the facing surface 40 of the negative electrode material layer 24 prior to sandwiching the porous sensory structure 19 between the facing surface 40 of the negative electrode material layer 24 and the second major surface 34 of the porous separator 16. The porous sensory structure 19 may be deposited on the porous separator 16 or the negative electrode material layer 24, for example, using a continuous roll-to-roll process. In embodiments where the porous sensory structure 19 is deposited on the porous separator 16, the sensory layer 36 may be deposited on the second major surface 34 of the porous separator 16 and then the buffer layer 38 may be deposited on the second major surface 34 of the porous separator 16 over the sensory layer 36.

Figure 2:
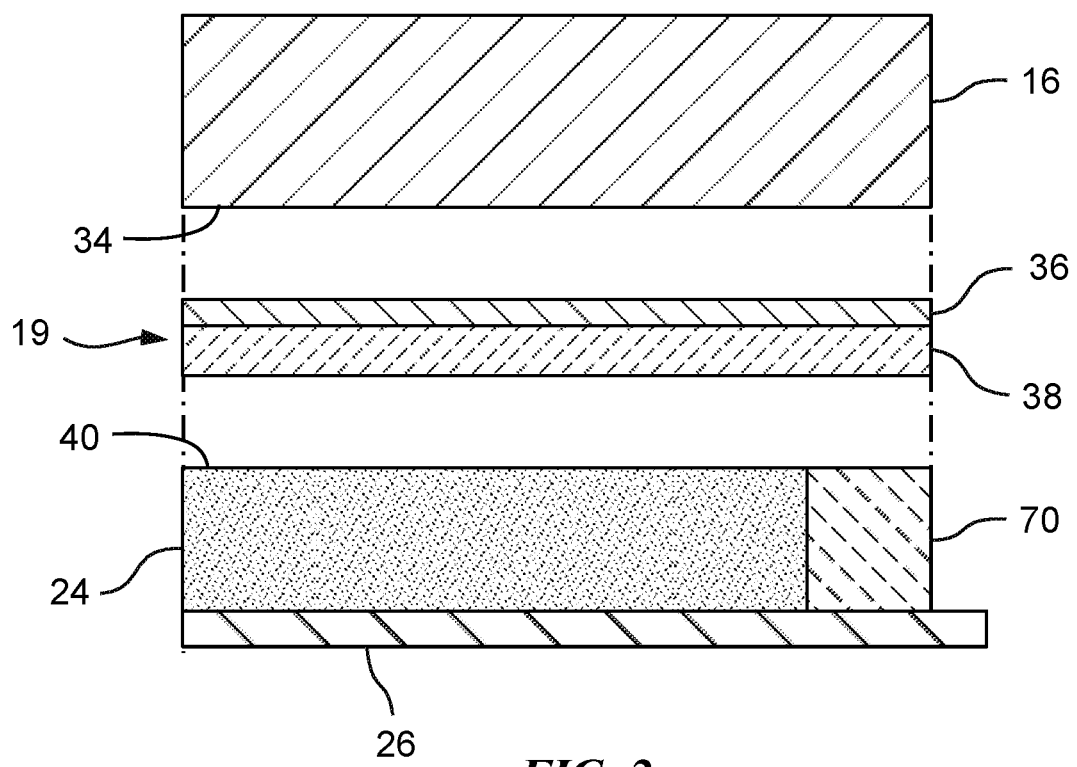
FIG. 2 is a schematic side cross-sectional view of the porous sensory structure of FIG. 1 during assembly of the electrochemical cell of FIG. 1, in accordance with one or more embodiments.

Referring now to FIG. 2, in embodiments where the porous sensory structure 19 is deposited on the negative electrode material layer 24, the buffer layer 38 may be deposited on the facing surface 40 of the negative electrode material layer 24 and then the sensory layer 36 may be deposited on the facing surface 40 of the negative electrode material layer 24 over the buffer layer 38. In such case, a spacer 70 may be deposited or positioned over at least a portion of the negative electrode current collector 26 that extends beyond the negative electrode material layer 24 prior to deposition of the porous sensory structure 19 on the negative electrode material layer 24 and the spacer 70 over the negative electrode current collector 26. The spacer 70 may be made of an electrically insulating material and/or a sacrificial material that may be removed from the negative electrode current collector 26 after formation of the porous sensory structure 19 on the negative electrode material layer 24.

The transducer 42 is configured to transduce or otherwise process the response produced by the sensory layer 36 into an output signal (e.g., an electrical signal, an electromagnetic signal, or a mechanical signal) that is representative of or indicative of one or more diagnostic conditions within the electrochemical cell 10. The output signal produced by the transducer 42 may be a signal that can be further processed by the microcontroller 46 or the external control device to diagnose certain conditions within the electrochemical cell 10. The transducer 42 may be an antenna, a resonator, an electrical potential difference sensor (e.g., a voltage sensor, voltmeter, or electrometer), a current sensor (e.g., a galvanometer or an ammeter), a resistance sensor (e.g., an ohmmeter or Wheatstone bridge), an analog-to-digital converter, or a digital-to-analog converter. The transducer 42 may be an inductive-type sensor (an inductor), a capacitive-type sensor (a capacitor), and/or a resistive-type sensor (a resistor). An antenna can transduce or convert electromagnetic radiation (e.g., radio waves) into an electrical signal (that may be processed by another device, such as a receiver) and can transduce or translate an electrical signal emitted by another device (e.g., a transmitter) into electromagnetic radiation (e.g., radio waves). A voltage sensor can convert a measured electrical potential difference between two points in an electrical circuit into an output signal. A current sensor can convert a measured current flowing through an electrically conductive pathway into an output signal. An analog-to-digital converter can convert an analog signal into a digital signal, and a digital-to-analog converter can convert a digital signal into an analog signal.

The monitoring assembly 18 depicted in FIG. 1 may be configured to diagnose formation of a lithium dendrite 50 on the facing surface 40 of the negative electrode material layer 24 that has grown though the buffer layer 38 and penetrated the sensory layer 36. In such case, the transducer 42 may be in the form of an electrical potential difference sensor, a current sensor, or another type of sensor or actuator whose output signal can be used to diagnose formation of the lithium dendrite 50. Prior to formation of the lithium dendrite 50, the transducer 42 may continuously or periodically sense the electrical potential difference between the sensory layer 36 and the negative electrode material layer 24, or the transducer 42 may sense the current flowing through the sensory layer 36. In addition, the transducer 42 may periodically or continuously transmit an output signal indicative or representative of the sensed potential difference or current to the microcontroller 46 or to an external control device that can process the output signal transmitted by transducer 42 into data that can be stored and/or used to diagnose formation of the lithium dendrite 50. For example, the microcontroller 46 may process the output signal generated by the transducer 42 into data and store the data in local memory as a function of time. When the lithium dendrite 50 penetrates the sensory layer 36, the lithium dendrite 50 may complete an electric circuit between the sensory layer 36 and the negative electrode material layer 24, which will necessarily change the electrical potential difference between the sensory layer 36 and the negative electrode material layer 24 and the amount of electric current flowing through the sensory layer 36. In such case, the microcontroller 46 may affirmatively diagnose formation of the lithium dendrite 50 by comparing the most recent data received from the transducer 42 to the historical data stored in memory and calculating the difference between the recent data and the historical data. If the microcontroller 46 determines that the electrical potential difference between the sensory layer 36 and the negative electrode material layer 24 has significantly decreased, or if the current flowing through the sensory layer 36 has significantly increased, the microcontroller 46 may affirmatively diagnose formation of the lithium dendrite 50.

Figure 3:
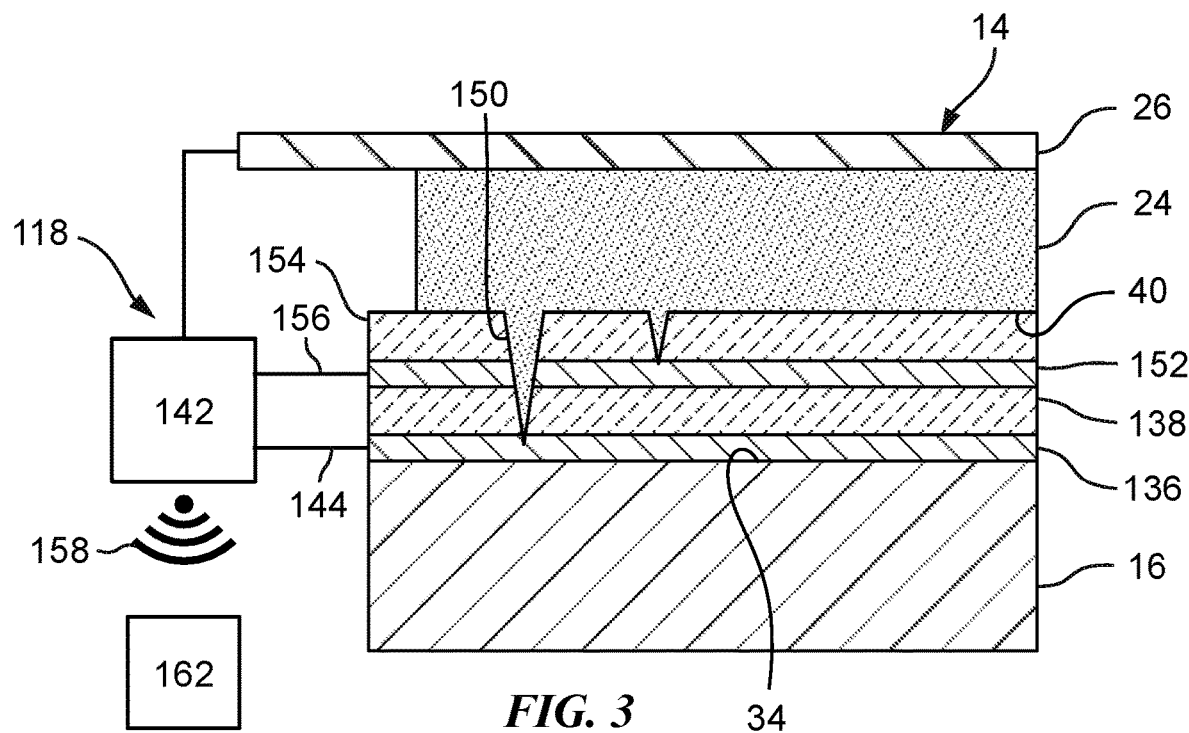
FIG. 3 is a schematic side cross-sectional view of a portion of an electrochemical cell including a monitoring assembly that uses a porous sensory structure in combination with a transducer to diagnose and/or monitor certain conditions within the electrochemical cell, wherein the porous sensory structure includes a first sensory layer disposed on a major surface of a porous separator, a first buffer layer overlying the first sensory layer, a second sensory layer overlying the first buffer layer, and a second buffer layer overlying the second sensory layer, and wherein the monitoring assembly is configured to diagnose and monitor lithium dendrite formation and growth within the electrochemical cell.

FIG. 3 depicts another embodiment of a monitoring assembly 118 that may be used to diagnose and/or monitor certain conditions within an electrochemical cell of a secondary lithium ion or lithium metal battery, such as the electrochemical cell 10 of FIG. 1. The monitoring assembly 118 is similar in many respects to the monitoring assembly 18 depicted in FIG. 1, and a description of common subject matter generally may not be repeated here. As shown in FIG. 3, in this embodiment, the monitoring assembly 118 includes a first sensory layer 136 disposed on the second major surface 34 of the porous separator 16, a first buffer layer 138 disposed on the second major surface 34 of the porous separator 16 over the first sensory layer 136, a second sensory layer 152 disposed on the second major surface 34 of the porous separator 16 over the first buffer layer 138, a second buffer layer 154 disposed on the second major surface 34 of the porous separator 16 over the second sensory layer 152, and a transducer 142. The first buffer layer 138 electrically isolates the first sensory layer 136 from the second sensory layer 152 and the second buffer layer 154 electrically isolates the second sensory layer 152 from the facing surface 40 of the negative electrode material layer 24. The transducer 142 is physically separate from the first and second sensory layers 136, 152 and is respectively physically coupled thereto by first and second electrical connectors 144, 156.

The monitoring assembly 118 depicted in FIG. 3 may be used to detect formation of a lithium dendrite 150 on the facing surface 40 of the negative electrode material layer 24 that has grown though the second buffer layer 154 and penetrated the second sensory layer 152 or the first sensory layer 136. In such case, the transducer 142 may be in the form of an electrical potential difference sensor, a current sensor, or another type of sensor or actuator whose output signal can be used to diagnose formation of the lithium dendrite 150. The transducer 142 may periodically or continuously transmit an output signal 158 to an external control device 162. The output signal 158 transmitted by the transducer 142 may be indicative or representative of the measured electrical potential difference between the negative electrode material layer 24 and the first and second sensory layers 136, 152 and/or the output signal 158 transmitted by the transducer 142 may be indicative or representative of the electric current flowing through the first and second sensory layers 136, 152. The external control device 162 may be configured to process the output signal 158 transmitted by transducer 142 to diagnose formation of the lithium dendrite 150 and optionally to determine the depth of penetration of the lithium dendrite 150. The thickness of the first and second sensory layers 136, 152 and/or the first and second buffer layers 138, 154 may be selected so that the monitoring assembly 118 can detect formation of lithium dendrites 150 that have reached certain predetermined depths of penetration in the overlying components of the electrochemical cell 10.

The output signal 158 transmitted by the transducer 142 may be in the form of electromagnetic radiation (e.g., radio waves) or an electrical signal. When the lithium dendrite 150 first penetrates the second sensory layer 152, the output signal 158 transmitted by the transducer 142 may be interpreted by the external control device 162 to affirmatively diagnose formation of the lithium dendrite 150. In addition, the output signal 158 transmitted by the transducer 142 may indicate that the lithium dendrite 150 has grown to a sufficient size to penetrate the second sensory layer 152 but has not yet penetrated the first sensory layer 136. If the lithium dendrite 150 continues to grow and subsequently penetrates the first sensory layer 136, the output signal 158 transmitted by the transducer 142 may be interpreted by the external control device 162 to affirmatively determine that the lithium dendrite 150 has grown to a sufficient size to penetrate both the first and second sensory layers 136, 152. In embodiments where the external control device 162 is configured to store historical data received from the transducer 142 in memory as a function of time, the external control device 162 may use the historical data to determine the growth rate of the lithium dendrite 150. In this way, the monitoring assembly 118 may track the progressive growth of the lithium dendrite 150 as a function of time.

In embodiments, the external control device 162 may be configured to receive data from other components of the electrochemical cell 10, e.g., from the positive and negative electrodes 12, 14 and/or the external circuit 30. The external control device 162 may receive data related to various operating conditions of the electrochemical cell 10 from such components (e.g., current, cell voltage, and/or the individual electrical potentials of the positive and negative electrode material layers 20, 24), and may store the data in memory as a function of time. In such case, the external control device 162 may use the historical data saved in memory to determine the growth rate and to track the growth of the lithium dendrite 150 as a function of the current, charge rate, cell voltage, and/or the electrical potentials of the positive and negative electrode material layers 20, 24.

Figure 4:
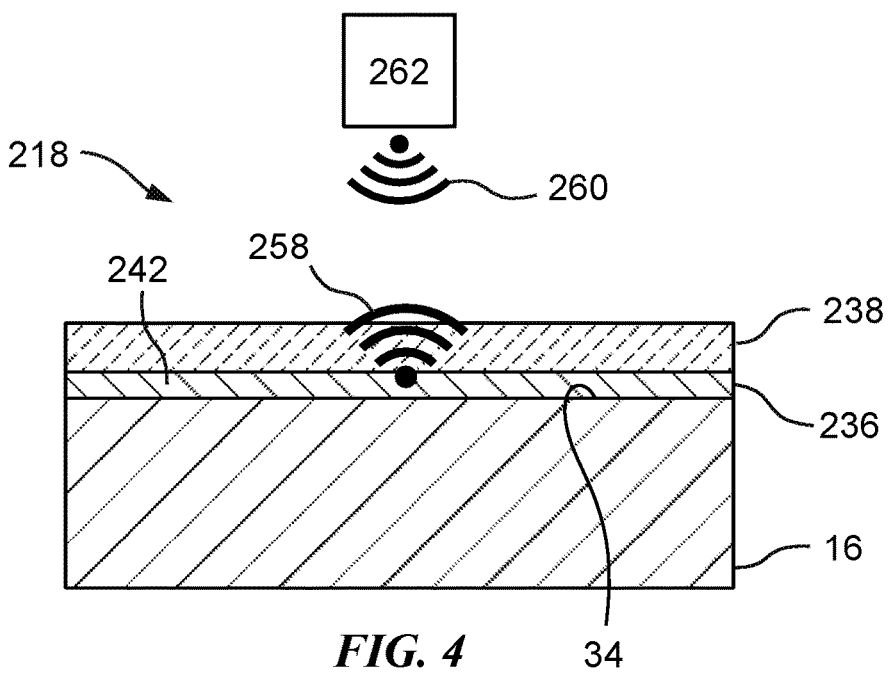
FIG. 4 is a schematic side cross-sectional view of a portion of an electrochemical cell including a monitoring assembly that uses a porous sensory structure in combination with a transducer to diagnose and/or monitor certain conditions within the electrochemical cell, wherein the porous sensory structure includes a sensory layer and a buffer layer, and wherein the transducer is integrated into the physical construction of the sensory layer.

FIG. 4 depicts another embodiment of a monitoring assembly 218 that may be used to diagnose and/or monitor certain conditions within an electrochemical cell of a secondary lithium ion or lithium metal battery, such as the electrochemical cell 10 of FIG. 1. The monitoring assembly 218 is similar in many respects to the monitoring assemblies 18, 118 depicted in FIGS. 1 and 3, and a description of common subject matter generally may not be repeated here. As shown in FIG. 4, in this embodiment, the monitoring assembly 218 includes a sensory layer 236 disposed on the second major surface 34 of the porous separator 16, a buffer layer 238 disposed on the second major surface 34 of the porous separator 16 over the sensory layer 236, and a transducer 242 that is integrated into the physical construction of the sensory layer 236. The monitoring assembly 218 may be configured to obtain identifying information about the electrochemical cell 10 and/or may be configured to diagnose certain conditions occurring within the electrochemical cell 10. The monitoring assembly 318 may be configured to diagnose volumetric changes in one or more components of the electrochemical cell 10 (e.g., the porous separator 16 and/or the negative electrode material layer 24), for example, that may alter the shape of the sensory layer 236.

The transducer 242 may be a passive transducer or sensor that may be configured to generate an output signal 258 in response to an excitation signal 260 from an external control device 262. The excitation signal 260 transmitted by the external control device 262 may be in the form of electromagnetic radiation (e.g., radio waves) or the excitation signal 260 may be in the form of an electric current (not shown) that is passed through the sensory layer 236. The output signal 258 produced by the transducer 242 may be in the form of electromagnetic radiation (e.g., radio waves), an electric current, or an electric or magnetic field. Examples of passive transducers include antennas, capacitors, and inductors. The transducer 242 may be integrated into the sensory layer 236 by patterning the electrically conductive material of the sensory layer 236 into the shape of an antenna, capacitor, or inductor. The external control device 262 may process the output signal 258 generated by the transducer 242, for example, in accordance with instructions stored in memory, to verify the identity of the electrochemical cell 10 of which the sensory layer 236 is a part or to diagnose certain conditions within the electrochemical cell 10, for example, by comparing the information represented by the output signal 258 to information stored in the memory of the external control device 262.

Figure 5:
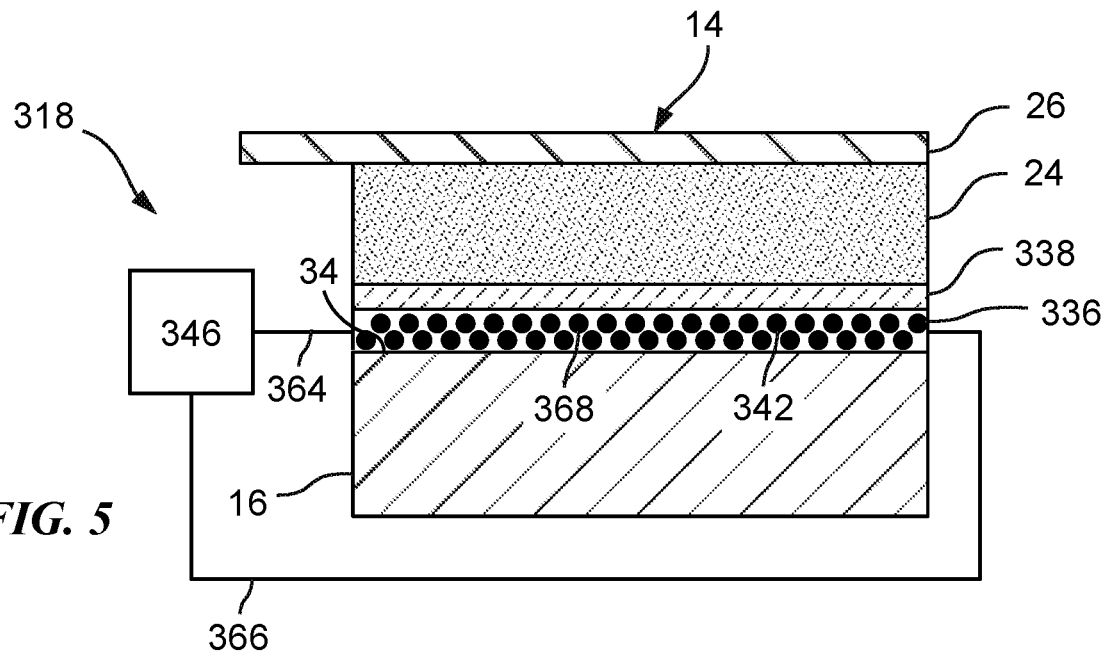
FIGS. 5, 6, and 7 are schematic side cross-sectional views of a portion of an electrochemical cell including a monitoring assembly that uses a porous sensory structure in combination with a transducer to diagnose and/or monitor certain conditions within the electrochemical cell, wherein the porous sensory structure includes a sensory layer and a buffer layer, the transducer is integrated into the physical construction of the sensory layer, and wherein the monitoring assembly is configured to diagnose volumetric changes in a porous separator and/or a negative electrode material layer of the electrochemical cell.
Figure 6:
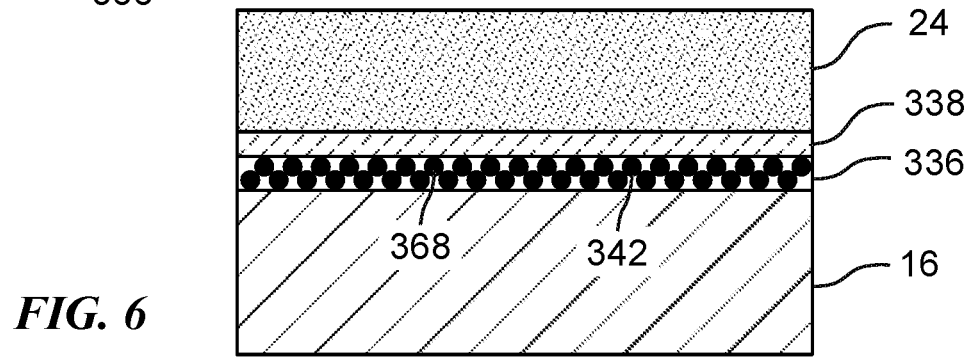
Figure 7:
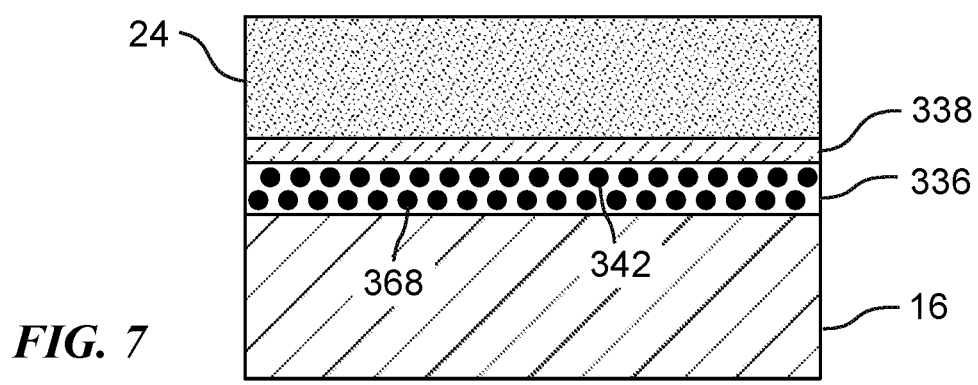

FIGS. 5, 6, and 7 depict another embodiment of a monitoring assembly 318 that may be used to diagnose and/or monitor certain conditions within an electrochemical cell of a secondary lithium ion or lithium metal battery, such as the electrochemical cell 10 of FIG. 1. The monitoring assembly 318 is similar in many respects to the monitoring assemblies 18, 118, 218 depicted in FIGS. 1, 3, and 4, and a description of common subject matter generally may not be repeated here. As shown in FIG. 5, in this embodiment, the monitoring assembly 318 includes a sensory layer 336 disposed on the second major surface 34 of the porous separator 16, a buffer layer 338 disposed on the second major surface 34 of the porous separator 16 over the sensory layer 336, a transducer 342 integrated into the physical construction of the sensory layer 336, and a microcontroller 346. The microcontroller 346 is electrically coupled to a first end of the sensory layer 336 via a first electrical connector 364 and is electrically coupled to a second end of the sensory layer 336 via a second electrical connector 366. The sensory layer 336 includes an electrically conductive material in the form of a plurality of discrete electrically conductive particles 368, and the transducer 342 may be defined by the arrangement of the electrically conductive particles 368 in the sensory layer 336. The electrically conductive particles 368 in the sensory layer 336 may be configured to provide an electrically conductive pathway through the sensory layer 336 and between the first and second ends of the sensory layer 336.

The monitoring assembly 318 depicted in FIG. 5 may be configured to diagnose changes in the volume of the porous separator 16 and/or the volume of the negative electrode material layer 24, for example, by detecting changes in the electrical resistance of the sensory layer 336. When a known voltage is applied across the sensory layer 336, for example, by the microcontroller 346, an electric current will flow through the sensory layer 336 along the electrically conductive pathway defined by the electrically conductive particles 368 in the sensory layer 336, and the amount of electric current flowing through the sensory layer 336 can be measured by the microcontroller 346. The microcontroller 346 can then calculate the resistance of the sensory layer 336 based upon instructions stored in memory according to Ohm's Law. The microcontroller 346 may periodically or continuously measure the current flowing through the sensory layer 336 and, using such measurement, calculate the resistance of the sensory layer 336.

Referring now to FIG. 6, when the negative electrode material layer 24 expands in volume, a compressive force will be applied to the adjacent sensory layer 336 by the negative electrode material layer 24, which may increase the packing density of the electrically conductive particles 368 in the sensory layer 336, resulting in a decrease in the electrical resistance of the sensory layer 336. Referring now to FIG. 7, alternatively, when the negative electrode material layer 24 contracts in volume (or the porous separator 16 expands in volume), a tensile force will be applied to the adjacent sensory layer 336 by the negative electrode material layer 24, which may decrease the packing density of the electrically conductive particles 368 in the sensory layer 336, resulting in an increase in the resistance of the sensory layer 336. The microcontroller 346 may compare the calculated resistance of the sensory layer 336 to historical resistance values stored in memory to diagnose volumetric changes of the porous separator 16 and/or the negative electrode material layer 24.

These and other benefits will be readily appreciated by those of ordinary skill in the art in view of the forgoing disclosure.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What is claimed is:

1. A monitoring assembly for an electrochemical cell of a secondary lithium battery, the electrochemical cell comprising a positive electrode layer, a negative electrode layer, and a porous separator disposed between the positive electrode layer and the negative electrode layer, the assembly comprising:
- a porous sensory structure disposed between a major surface of the porous separator and a facing surface of the negative electrode layer, the porous sensory structure including:
- a sensory layer disposed on the major surface of the porous separator, the sensory layer including an electrically conductive material;
- a buffer layer disposed between the sensory layer and the facing surface of the negative electrode layer, the buffer layer being made of an electrically insulating material that electrically isolates the sensory layer from the facing surface of the negative electrode layer; and
- a transducer integrated into the sensory layer by patterning the electrically conductive material of the sensory layer into the shape of an antenna, the transducer being configured to produce an output signal in response to an electromagnetic input signal.

2. The assembly of claim 1 wherein the electrically insulating material of the buffer layer includes at least one of $Al_2O_3$, $SiO_2$, $ZrO_2$, $TiO_2$, $ZnO$, $Ta_2O_5$, $La_2O_5$, $HfO$, lithium-lanthanum-zirconium oxide, a zeolite, polytetrafluoroethylene, aluminum alkoxide, zirconium alkoxide, titanium alkoxide, or diamond-like carbon.

3. The assembly of claim 1 wherein the transducer is configured to produce an electromagnetic output signal in response to an electromagnetic input signal.

4. The assembly of claim 1 wherein the transducer is configured to produce an electric output signal in response to an electromagnetic input signal.

5. The assembly of claim 1 wherein the transducer is configured to produce an electromagnetic output signal in response to an electric input signal.

6. The assembly of claim 1 wherein the output signal generated by the transducer is indicative of formation of a lithium dendrite that extends from the facing surface of the negative electrode layer and penetrates the sensory layer.

7. The assembly of claim 1 wherein the output signal generated by the transducer is indicative of a volumetric change in the negative electrode layer and/or the porous separator.

8. The assembly of claim 1 wherein the output signal generated by the transducer is indicative of a compressive force or a tensile force applied to the sensory layer that results in physical deformation of the sensory layer.

9. The assembly of claim 1 further comprising:
- a microcontroller configured to process the output signal generated by the transducer into data and to store the data in local memory as a function of time.

10. The assembly of claim 9 wherein the microcontroller is electrically coupled to the sensory layer via an electrical circuit.

11. An electrochemical cell of a secondary lithium battery, the electrochemical cell comprising:
- a positive electrode layer electrically coupled to a positive electrode current collector;
- a negative electrode layer spaced apart from the positive electrode layer and electrically coupled to a negative electrode current collector;
- a porous separator disposed between the positive electrode layer and the negative electrode layer and having a first major surface and an opposite second major surface, the first major surface of the porous separator facing toward a facing surface of the negative electrode layer; and
- a monitoring assembly including:
- a porous sensory structure disposed between the first major surface of the porous separator and the facing surface of the negative electrode layer, the porous sensory structure including:
- a sensory layer disposed on the first major surface of the porous separator, the sensory layer including an electrically conductive material,
- a buffer layer disposed between the sensory layer and the facing surface of the negative electrode layer, the buffer layer being made of an electrically insulating material that electrically isolates the sensory layer from the facing surface of the negative electrode layer; and
- a transducer integrated into the sensory layer by patterning the electrically conductive material of the sensory layer into the shape of an antenna, the transducer being configured to produce an output signal in response to an electromagnetic input signal, the output signal being indicative of a diagnostic condition of the porous separator or the negative electrode layer.

12. The electrochemical cell of claim 11 further comprising:
- a microcontroller configured to process the output signal generated by the transducer into data and to store the data in local memory as a function of time.

13. The electrochemical cell of claim 12 wherein the microcontroller is electrically coupled to the negative electrode current collector via a first electrical connector and is electrically coupled to the positive electrode current collector via a second electrical connector, and wherein the microcontroller is powered by an electrical potential difference between the negative electrode current collector and the positive electrode current collector.

14. The electrochemical cell of claim 11 wherein the sensory layer includes an electrochemically active reference electrode material, the electrochemically active reference electrode material comprising at least one metal oxide of lithium iron phosphate, lithium titanium oxide, or lithium nickel manganese cobalt oxide.

15. The electrochemical cell of claim 11 wherein the porous separator is made of an ionically conductive polymeric material comprising at least one of polyethylene, polypropylene, polyamide, poly(tetrafluoroethylene), polyvinylidene fluoride, or poly(vinyl chloride), the electrically conductive material of the sensory layer is electrochemically inactive and comprises particles of at least one of nickel, copper, silver, gold, or carbon, and the electrically insulating material of the buffer layer comprises at least one of $Al_2O_3$, $SiO_2$, $ZrO_2$, $TiO_2$, $ZnO$, $Ta_2O_5$, $La_2O_5$, $HfO$, lithium-lanthanum-zirconium oxide, a zeolite, polytetrafluoroethylene, aluminum alkoxide, zirconium alkoxide, titanium alkoxide, or diamond-like carbon.

16. The electrochemical cell of claim 11 wherein the negative electrode layer comprises:
- at least one of graphite or silicon, or a layer of lithium metal, and wherein the layer of lithium metal comprises, by weight, greater than 97% lithium.

17. An electrochemical cell of a secondary lithium battery, the electrochemical cell comprising:
- a positive electrode layer electrically coupled to a positive electrode current collector;
- a negative electrode layer spaced apart from the positive electrode layer and electrically coupled to a negative electrode current collector;
- a porous separator disposed between the positive electrode layer and the negative electrode layer and having a first major surface and an opposite second major surface, the first major surface of the porous separator facing toward a facing surface of the negative electrode layer; and
- a monitoring assembly including:
  - a porous sensory structure disposed between the first major surface of the porous separator and the facing surface of the negative electrode layer, the porous sensory structure including:
  - a sensory layer having a first end and an opposite second end and being disposed on the major surface of the porous separator, the sensory layer including electrically conductive particles configured to provide an electrically conductive pathway through the sensory layer between the first end and the opposite second end thereof, the electrically conductive particles being arranged in the sensory layer such that, in response to a compressive force or a tensile force applied to the sensory layer, a packing density of the electrically conductive particles respectively increases or decreases;
  - a buffer layer disposed between the sensory layer and the facing surface of the negative electrode layer, the buffer layer being made of an electrically insulating material that electrically isolates the sensory layer from the facing surface of the negative electrode layer; and
  - a transducer integrated into the sensory layer by patterning the electrically conductive material of the sensory layer into the shape of an antenna, the transducer being configured to produce an output signal in response to an electromagnetic input signal, the output signal being indicative of a diagnostic condition of the porous separator or the negative electrode layer; and
  - a microcontroller electrically coupled to the first end of the sensory layer via a first electrical connector and to the second end of the sensory layer via a second electrical connector, the microcontroller being configured to determine an electrical resistance of the sensory layer and to diagnose volumetric changes in the negative electrode layer and/or the porous separator in response to changes in the electrical resistance of the sensory layer.

18. The assembly of claim 17 wherein the porous separator is made of an ionically conductive polymeric material comprising at least one of polyethylene, polypropylene, polyamide, poly(tetrafluoroethylene), polyvinylidene fluoride, or poly(vinyl chloride), the electrically conductive material of the sensory layer is electrochemically inactive and comprises particles of at least one of nickel, copper, silver, gold, or carbon, and the electrically insulating material of the buffer layer comprises at least one of $Al_2O_3$, $SiO_2$, $ZrO_2$, $TiO_2$, $ZnO$, $Ta_2O_5$, $La_2O_5$, $HfO$, lithium-lanthanum-zirconium oxide, a zeolite, polytetrafluoroethylene, aluminum alkoxide, zirconium alkoxide, titanium alkoxide, or diamond-like carbon.

19. The assembly of claim 1 wherein the electrically conductive material being electrochemically inactive and including particles of at least one of nickel, copper, silver, gold, or carbon.

20. The electrochemical cell of claim 11 further comprising:
- a nonaqueous liquid electrolyte solution infiltrating the porous separator and the porous sensory structure.

* * * * *